(12) United States Patent
Kim et al.

(10) Patent No.: US 9,048,192 B2
(45) Date of Patent: Jun. 2, 2015

(54) METHOD OF FORMING A PATTERN

(75) Inventors: Dong-kwon Kim, Yongin-si (KR); Ki-il Kim, Yongin-si (KR); Ah-young Cheon, Suwon-si (KR); Myeong-cheol Kim, Suwon-si (KR); Yong-jin Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 53 days.

(21) Appl. No.: 13/493,146

(22) Filed: Jun. 11, 2012

(65) Prior Publication Data

US 2012/0322268 A1 Dec. 20, 2012

(30) Foreign Application Priority Data

Jun. 14, 2011 (KR) .................... 10-2011-0057604

(51) Int. Cl.
*H01L 21/00* (2006.01)
*H01L 21/3065* (2006.01)
*H01L 21/308* (2006.01)

(52) U.S. Cl.
CPC ...... *H01L 21/30655* (2013.01); *H01L 21/3065* (2013.01); *H01L 21/3086* (2013.01)

(58) Field of Classification Search
USPC .................................. 438/694–702
See application file for complete search history.

(56) References Cited

U.S. PATENT DOCUMENTS

| | | | | |
|---|---|---|---|---|
| 4,534,824 A * | 8/1985 | Chen | ............................ | 438/421 |
| 5,211,986 A * | 5/1993 | Ohkubo | ......................... | 427/240 |
| 6,406,982 B2 * | 6/2002 | Urakami et al. | ............. | 438/492 |
| 7,425,507 B2 * | 9/2008 | Lake | ............................ | 438/694 |
| 7,560,386 B2 * | 7/2009 | Cha et al. | ........................ | 438/700 |
| 8,124,493 B2 * | 2/2012 | Komeda | ......................... | 438/396 |
| 8,173,543 B2 * | 5/2012 | Seki et al. | ...................... | 438/667 |
| 8,318,583 B2 * | 11/2012 | Jeong et al. | .................... | 438/427 |
| 8,659,152 B2 * | 2/2014 | Fujita | ............................. | 257/737 |
| 2007/0001267 A1 * | 1/2007 | Ayazi et al. | ................... | 257/622 |
| 2007/0218619 A1 * | 9/2007 | Cha et al. | ........................ | 438/201 |
| 2007/0281474 A1 * | 12/2007 | Suzuki et al. | ................. | 438/677 |
| 2008/0038922 A1 * | 2/2008 | Lamers et al. | ................ | 438/694 |
| 2009/0242512 A1 * | 10/2009 | Beaudry | ......................... | 216/49 |
| 2010/0055400 A1 | 3/2010 | Farr et al. | | |
| 2011/0008959 A1 * | 1/2011 | Morgan | ........................ | 438/652 |

(Continued)

FOREIGN PATENT DOCUMENTS

| | | | |
|---|---|---|---|
| EP | 2154582 | * | 2/2010 |
| KR | 10-2010-0043436 | | 4/2010 |
| KR | 10-2010-0078110 | | 7/2010 |

OTHER PUBLICATIONS

"Deep Reactive Ion Etching" by Alexandre Reis.*

(Continued)

*Primary Examiner* — Charles Garber
*Assistant Examiner* — Evren Seven
(74) *Attorney, Agent, or Firm* — Onello & Mello, LLP

(57) ABSTRACT

A method of forming a pattern includes forming a mask pattern on a substrate; etching the substrate by deep reactive ion etching (DRIE) and by using the mask pattern as an etch mask; partially removing the mask pattern to expose a portion of an upper surface of the substrate; and etching the exposed portion of the upper surface of the substrate. In the method, when a pattern is formed by DRIE, an upper portion of the pattern does not protrude or scarcely protrudes, and scallops of a sidewall of the pattern are smooth, and thus a conformal material layer may be easily formed on a surface of the pattern.

20 Claims, 11 Drawing Sheets

(56) References Cited

U.S. PATENT DOCUMENTS

| | | | |
|---|---|---|---|
| 2011/0141860 A1* | 6/2011 | Verardo et al. | 368/322 |
| 2011/0201205 A1* | 8/2011 | Sirajuddin et al. | 438/702 |
| 2011/0207323 A1* | 8/2011 | Ditizio | 438/675 |
| 2012/0060607 A1* | 3/2012 | Yoshida | 73/579 |
| 2012/0199984 A1* | 8/2012 | Fujita et al. | 257/774 |
| 2013/0237062 A1* | 9/2013 | Winniczek et al. | 438/719 |

OTHER PUBLICATIONS

"Deep Reactive Ion Etching" (DRIE), Alexandre Reis and Raj Bhattacharya, Mar. 16, 2004.*

* cited by examiner

FIG. 5A
FIG. 5B
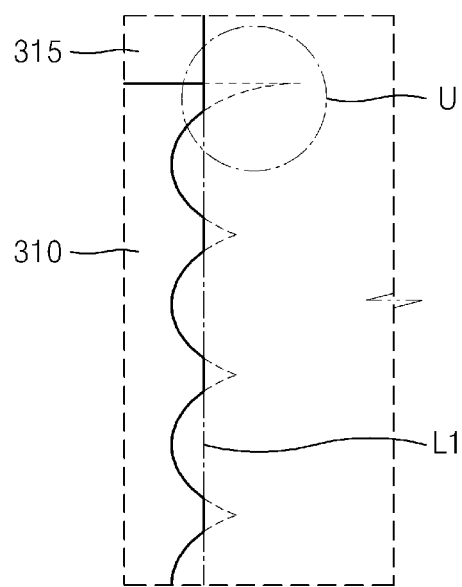
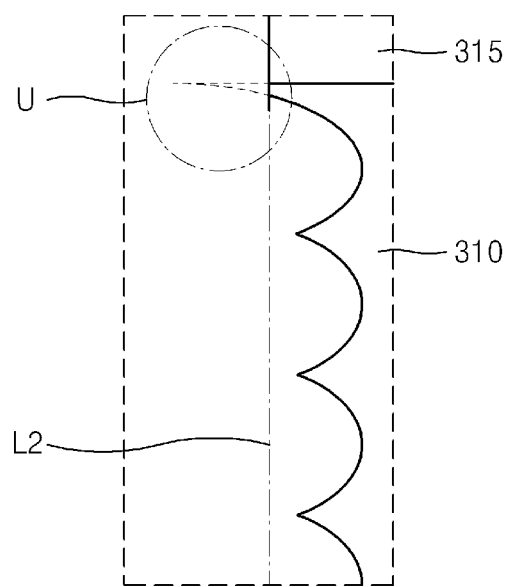

METHOD OF FORMING A PATTERN

CROSS-REFERENCE TO RELATED PATENT APPLICATION

This application claims the benefit of Korean Patent Application No. 10-2011-0057604, filed on Jun. 14, 2011, in the Korean Intellectual Property Office, the disclosure of which is incorporated herein in its entirety by reference.

BACKGROUND

The present inventive concept relates to a pattern-forming method, and more particularly, to a pattern-forming method by which, when a pattern is formed by deep reactive ion etching (DRIE), an upper portion of the pattern does not provide or scarcely protrudes, and scallops of a sidewall of the pattern are smooth.

As electronic products become more light and compact, the demand for fine devices increases; and methods of manufacturing the fine devices are diversifying. To obtain fine devices with good performance, further improvement of the methods of manufacturing the fine devices is needed.

SUMMARY

The inventive concept provides a method of forming a pattern, the method being capable of easily forming a conformal material layer on a patterned surface of a substrate.

The inventive concept also provides a method of forming a through-silicon via hole, by which a conformal material layer can be easily formed on a patterned surface of a substrate.

According to an aspect of the inventive concept, a method of forming a pattern includes forming a mask pattern on a substrate; etching the substrate by deep reactive ion etching (DRIE) and by using the mask pattern as an etch mask; partially removing the mask pattern to expose a portion of an upper surface of the substrate; and etching the exposed portion of the upper surface of the substrate.

Before etching the substrate by DRIE, the method may further include forming an auxiliary mask pattern on a sidewall of the mask pattern. The partial removal of the mask pattern may include removing the auxiliary mask pattern. The partial removal of the mask pattern may further include vertically removing the mask pattern. In particular, the vertical removal of the mask pattern and the removal of the auxiliary mask pattern may be simultaneously performed.

The partial removal of the mask pattern to expose the portion of the upper surface of the substrate may be performed by isotropic etching.

A material layer, such as a silicon oxide, may be formed between the substrate and the mask pattern.

The etching of the substrate by the DRIE may include performing isotropic etching; forming a protective layer on a surface produced by the isotropic etching; and performing anisotropic etching on a portion of the protective layer to remove that portion of the protective layer. The performance of the isotropic etching, the formation of the protective layer, and the removal of the portion of the protective layer may constitute a cycle that may be performed at least twice. A plurality of scallops may be adjacently generated on a lateral-direction surface of the substrate that is obtained in the etching of the substrate by the DRIE, and crests between the scallops may be smoothed in the etching of the exposed portion of the upper surface of the substrate. The depth to which the substrate is etched by the DRIE may be 5 μm to 500 μm.

According to another aspect of the inventive concept, a method of forming a through-silicon via hole includes providing a semiconductor substrate having a material layer formed on one surface of the semiconductor substrate; forming a mask pattern on the material layer; etching the material layer by using the mask pattern as an etch mask; forming an auxiliary mask pattern on a sidewall of the material layer; etching the semiconductor substrate by deep reactive ion etching (DRIE) and by using the mask pattern and the auxiliary mask pattern as etch masks; removing the auxiliary mask pattern to expose a portion of an upper surface of the semiconductor substrate; and etching the exposed portion of the upper surface of the semiconductor substrate.

The material layer may be an interlayer dielectric (ILD) layer. The material layer may have a sufficient etch selectivity that the material layer is not substantially etched in the removal of the auxiliary mask pattern. In particular, the auxiliary mask pattern may include a carbon-based polymer material.

A semiconductor device that can be produced via the above-described methods includes a semiconductor substrate with a hole extending at least partially through the substrate, wherein the semiconductor substrate includes a scalloped sidewall extending from a surface of the substrate, wherein the scalloped sidewall defines the hole, wherein the scallops of the sidewall are smooth, and wherein a portion of the sidewall adjacent the substrate surface does not protrude inward, restricting the through-hole, to a greater degree than does an interior portion of the sidewall deeper in the substrate.

The semiconductor device can further include a mask pattern on the semiconductor substrate, wherein the mask pattern defines an aperture aligned with the sidewall. The semiconductor device can also a material layer between the mask pattern and the substrate. The material layer can include a silicon oxide or a polymer.

BRIEF DESCRIPTION OF THE DRAWINGS

Exemplary embodiments of the inventive concept will be more clearly understood from the following detailed description taken in conjunction with the accompanying drawings in which:

FIGS. 5A and 5B are magnified views of portions $V_a$ and $V_b$, respectively, of FIG. 4E.

DETAILED DESCRIPTION OF THE EMBODIMENTS

Figure 1A:
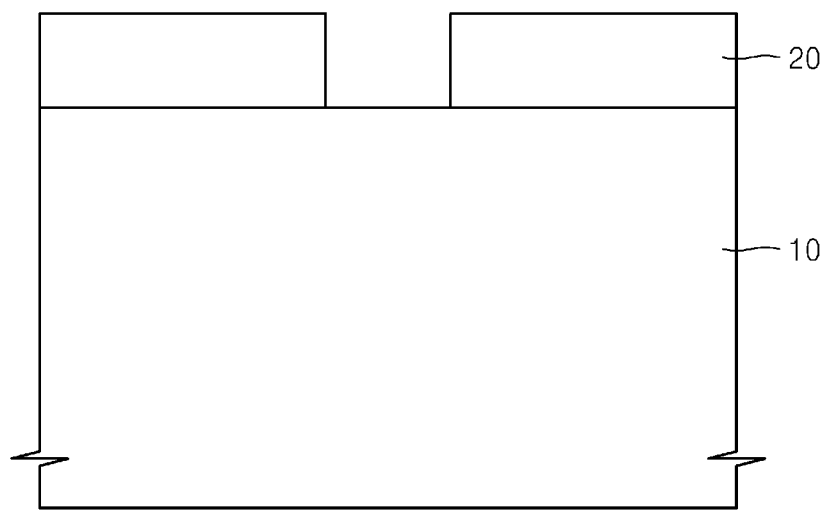
FIGS. 1A-1F are cross-sectional side views illustrating a process of deep reactive ion etching (DRIE)

Hereinafter, the inventive concept will be described more fully with reference to the accompanying drawings, in which exemplary embodiments of the inventive concept are shown. The embodiments of the inventive concept may, however, be embodied in many different forms and should not be construed as limited to the exemplary embodiments set forth herein. Rather, these embodiments are provided so that this disclosure will be thorough and complete, and will fully convey the scope of the inventive concept to those skilled in the art. Like numbers refer to like elements throughout the specification. Various elements and regions illustrated in the drawings are schematic in nature. Thus, the inventive concept is not limited to relative sizes or intervals illustrated in the accompanying drawings.

While such terms as "first," "second," etc., may be used to describe various components, such components must not be limited to the above terms. The above terms are used only to distinguish one component from another. For example, a first component discussed below could be termed a second component, and similarly, a second component may be termed a first component without departing from the teachings of this disclosure.

The terminology used herein is for the purpose of describing particular embodiments only and is not intended to limit the inventive concept. An expression used in the singular encompasses the expression in the plural, unless it has a clearly different meaning in the context. It will be understood that the terms "comprises" and/or "comprising," when used in this specification, specify the presence of stated features, integers, steps, operations, elements, components, and/or groups thereof, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1A through 1F are cross-sectional side views illustrating a process of deep reactive ion etching (DRIE).

Referring to FIG. 1A, a mask pattern 20 that defines an aperture is formed on a substrate 10.

The substrate 10 may include a semiconductor material, such as a Group IV semiconductor, a Group III-V compound semiconductor, or a Group II-VI oxide semiconductor. For example, the Group IV semiconductor may include silicon, germanium, or silicon-germanium. The substrate 10 may be a bulk wafer or an epitaxial layer. Alternatively, the substrate 10 may be a silicon-on-insulator (SOI) substrate, a gallium-arsenide substrate, a silicon germanium substrate, a ceramic substrate, a quartz substrate, or a glass substrate for use in displays. Unit devices (not shown) for forming a semiconductor device, such as various types of active devices or passive devices, may be formed on the substrate 10. Device isolation layers (not shown) for isolating the unit devices from one another may also be formed on the substrate 10. For example, the isolation layers may be formed by local oxidation of silicon (LOCOS) or by shallow trench isolation (STI). An interlayer insulation layer (not shown) covering the unit devices may be formed on the substrate 10. Conductive regions (not shown) that may be electrically connected to the unit devices via the interlayer insulation layer may also be formed on the substrate 10. Conductive lines (not shown) for connecting the unit devices or the conductive regions to one another may also be formed on the substrate 10.

The mask pattern 20 may be formed of any material provided it has an etch selectivity with respect to the substrate 10. For example, the mask pattern 20 may be a photoresist, a silicon nitride layer, a silicon oxide layer, a silicon oxynitride layer, or a carbon-based material layer such as an amorphous carbon layer (ACL) and a spin-on-hardmask (SOH).

Figure 1B:
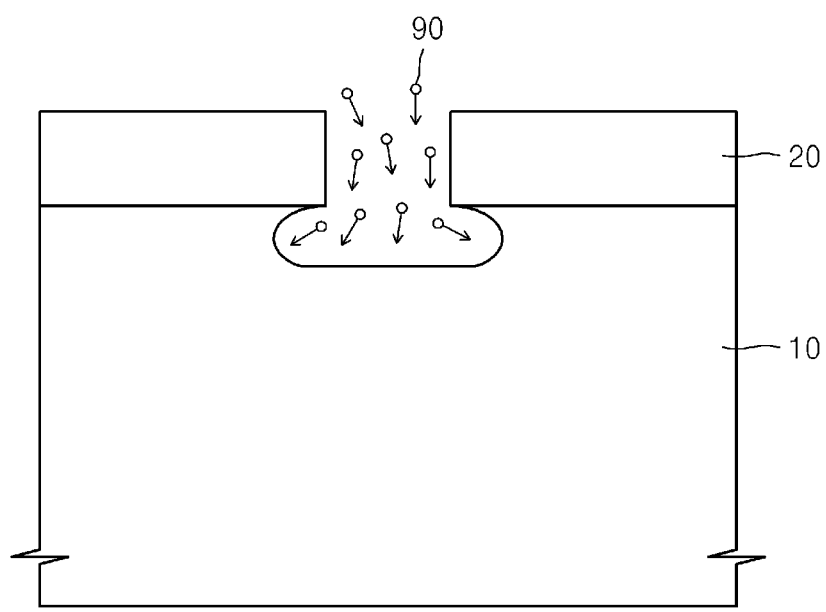

Referring to FIG. 1B, the substrate 10 is etched by using the mask pattern 20 as an etch mask. An etch gas 90 may be, for example, $SF_6$, $NF_3$, $XeF_2$, $F_2$, $CF_4$, $HBr$, $Cl_2$, $ClF_3$, or $HF$. The etch gas 90 may be plasma-excited in various manners and may react with the substrate 10 so that the pattern of the mask pattern 20 may be transferred to the substrate 10.

Figure 1C:
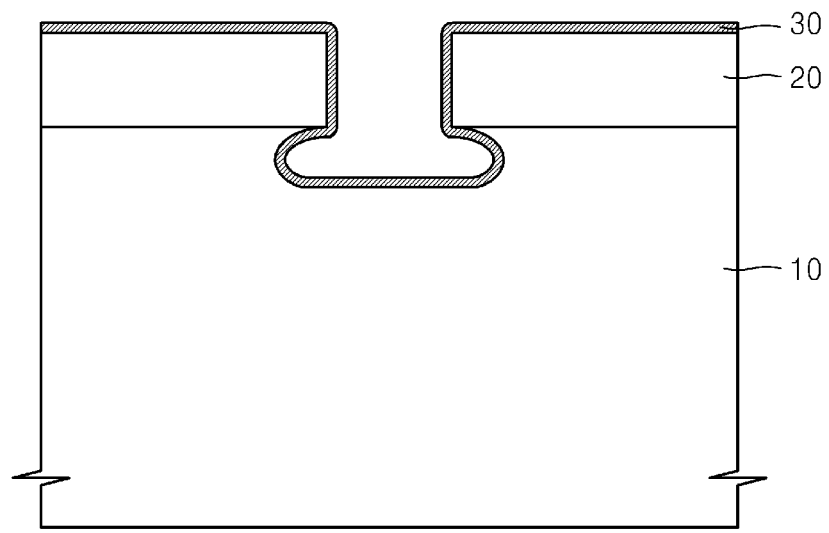

Referring to FIG. 1C, a protective layer 30 is formed using an appropriate precursor. The protective layer 30 may be formed by plasma-exciting, for example, a carbon fluoride ($C_xF_y$)-based precursor and depositing the $C_xF_y$-based precursor on the entire surface of the structure resulting from the etching of FIG. 1B. The $C_xF_y$-based precursor may be, for example, $C_2F_6$, $C_3F_8$, $CHF_3$, $CH_2F_2$, or $C_4F_8$. When the $C_xF_y$-based precursor is deposited on the surface of the resultant structure, polytetrafluoroethylene (PTFE)-based polymer may be conformally formed.

Figure 1D:
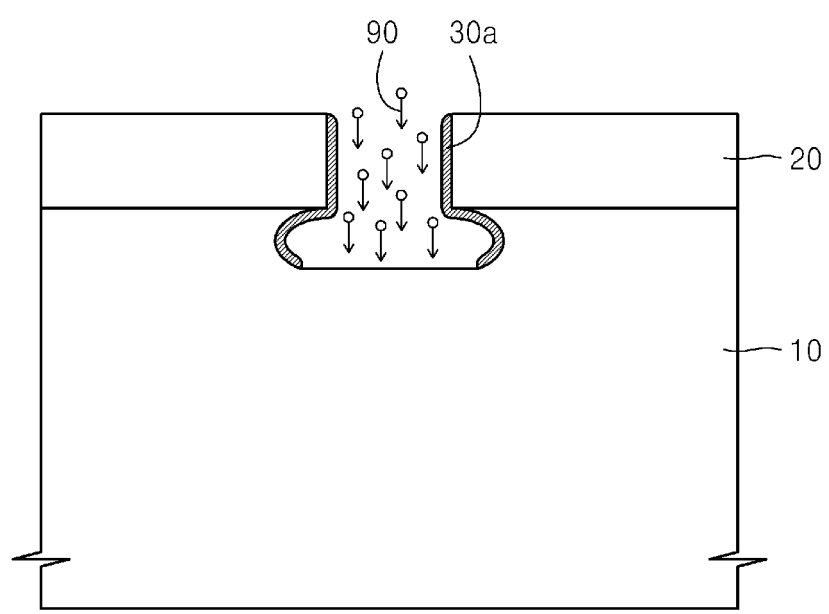

Referring to FIG. 1D, the plasma of the etch gas 90 may be forced to move anisotropically to remove a part of the protective layer 30. The anisotropic movement may be achieved by applying a bias voltage to the substrate 10. Since the protective layer 30 is etched by the etch gas 90 moving anisotropically, a portion of the protective layer 30 that is on a sidewall of the mask pattern 20 is rarely influenced, and a portion of the protective layer 30 that is formed on the horizontal plane of FIG. 1D may be removed via physical sputtering to thus obtain a protective layer 30a.

Figure 1E:
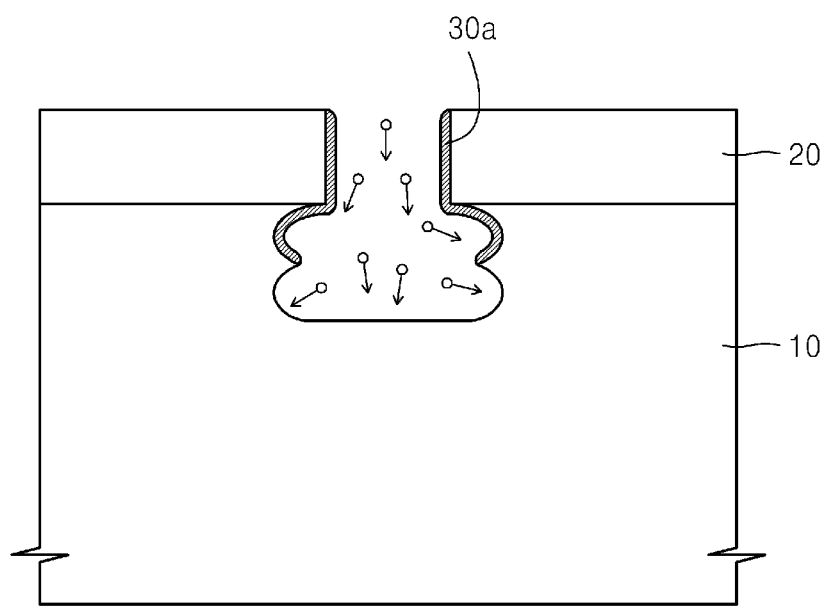

Referring to FIG. 1E, the substrate 10 is etched under the same conditions as in FIG. 1B. Next, a portion of the substrate 10 that is covered by the mask pattern 20 and a portion of the protective layer 30a that is on the sidewall of the substrate 10 are not etched, and an exposed portion of the substrate 10 is further etched. A cycle of these operations of FIGS. 1B-1D is repeated, and the mask pattern 20 and the protective layer 30a are then removed, so that a resultant structure illustrated in FIG. 1F may be obtained.

Figure 1F:
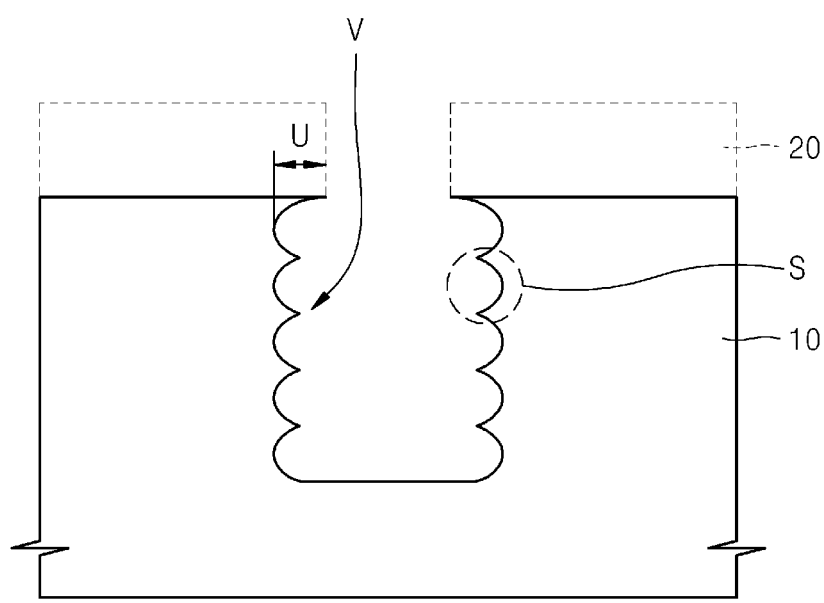

Referring to FIG. 1F, scallops S corresponding to the repeated cycles, respectively, may be consecutively arranged in a vertical direction. The scallops S may form pointy crest V at points where the scallops S meet. In particular, a border between the upper surface of the substrate 10 and an uppermost scallop S may form an undercut U. In some cases, an uppermost protrusion formed as a result of the undercut U may protrude more than the crests V between the scallops S due to irregular etching in an early stage of etching.

Such an undercut U not only makes the pattern formed in the substrate 10 recede from the mask pattern 20 that we intended to be transferred to the substrate 10, but may also cause voids due to protrusion at an acute angle when forming a predetermined material layer. Such voids may act negatively and may, for example, cause a device failure. Accordingly, the following manufacturing method may be used to remove or minimize the undercut U.

FIGS. 2A-2D are cross-sectional side views illustrating a pattern-forming method according to an exemplary embodiment of the inventive concept.

Figure 2A:
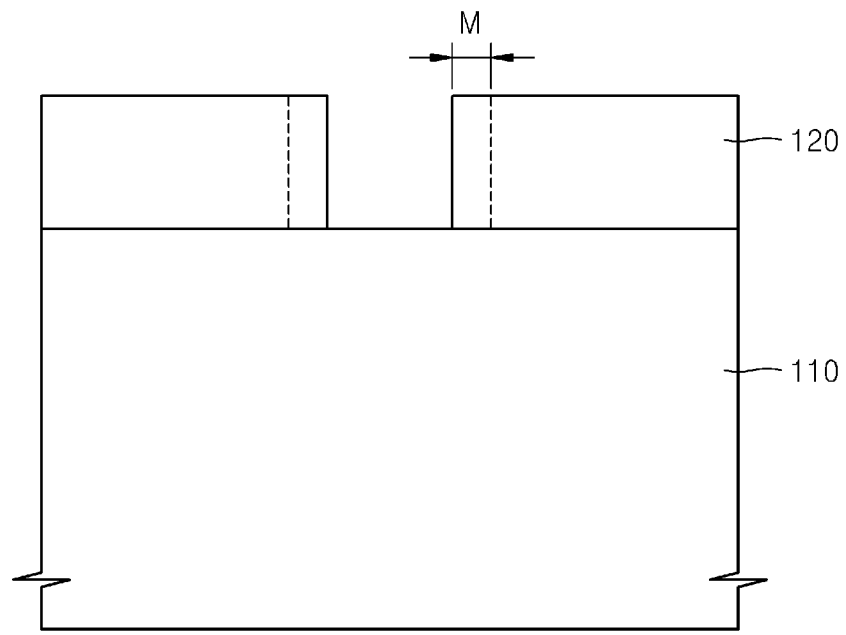
FIGS. 2A-2D are cross-sectional side views illustrating a pattern-forming method according to an exemplary embodiment of the inventive concept.

Referring to FIG. 2A, a mask pattern 120 is formed on a substrate 110. In consideration of an undercut that may be generated during DRIE, the mask pattern 120 may be formed to create a margin with a size of M, which is expected to be the size of the undercut and which extends from a target pattern (indicated by a dashed line) as illustrated in FIG. 2A.

Figure 2B:
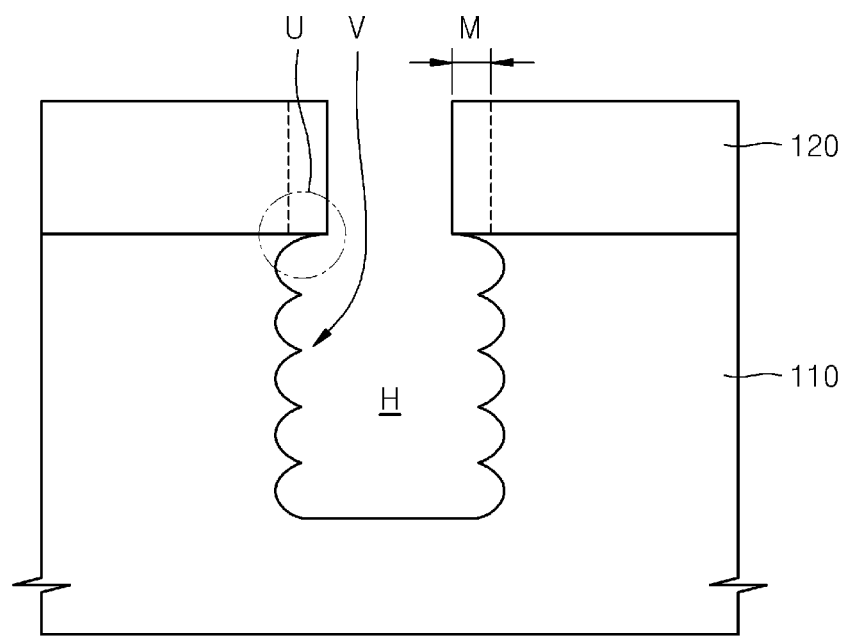

Referring to FIG. 2B, a hole H having a predetermined depth may be formed via the DRIE, as explained above. Although a hole pattern is illustrated herein as an example, the inventive concept is not limited thereto and may be applied to any pattern. Although the hole H extends from the substrate surface to only a predetermined depth of the substrate 110 in FIG. 2B, the hole H may pass through the substrate 110.

The hole H may be formed by the above-described DRIE. As explained above, a scallop may deeply burrow into an area below the mask pattern 120 due to somewhat irregular etching at an early stage of the DRIE. Consequently, a protrusion U may be generated, as illustrated in FIG. 2B.

Due to continuation of DRIE, scallops are formed in the vertical direction of FIG. 2B, and an arrangement of the scallops forms a wave and thus forms a pointy crest V at each border between adjacent scallops. The DRIE may be performed as explained above with reference to FIGS. 1A-1F.

The crests and troughs of waves formed by the scallops are located along almost straight lines, respectively. Meanwhile the protrusion U may protrude more than the locations of the crests of the waves due to somewhat irregular etching at an early stage of DRIE, as described above.

The troughs of the waves may be formed around an initially intended patterning location indicated by the dashed line of FIG. 2B. However, the troughs of the waves may not accurately coincide with the patterning location. When the mask pattern 120 is formed, the size, M, which is a margin from the target pattern (indicated by the dashed line), may be adjusted so as to align the troughs of the waves with the patterning location.

Figure 2C:
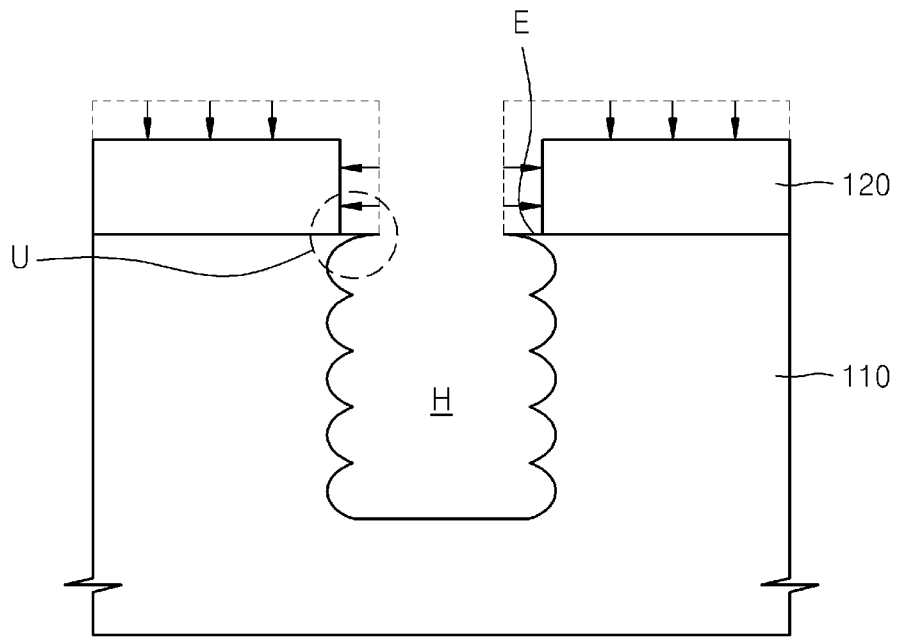

Referring to FIG. 2C, the mask pattern 120 may be partially removed to expose part of an upper surface E of the substrate 110. The mask pattern 120 may be partially removed by isotropically etching the mask pattern 120. The isotropic etching may be performed until the mask pattern 120 turns into the target pattern indicated by the dashed line in FIG. 2B.

The isotropic etching may be performed using, for example, an ashing method that uses an oxygen-based material but is not limited thereto.

Figure 2D:
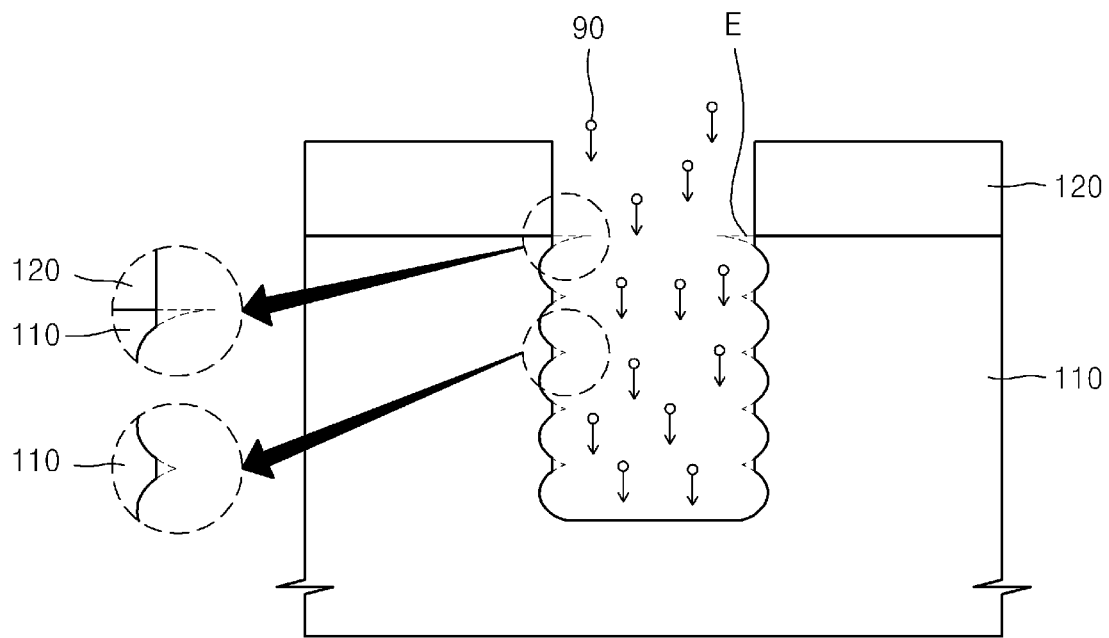

Referring to FIG. 2D, the substrate 110 is anisotropically etched using the mask pattern 120 as an etch mask. An etch gas used in the anisotropic etching may be, for example, $SF_6$, $NF_3$, $XeF_2$, $F_2$, $CF_4$, HBr, $Cl_2$, $ClF_3$, or HF, but is not limited thereto.

Through the anisotropic etching, a considerable amount of the protrusion U may be removed as illustrated in FIG. 2D. The crests V between adjacent scallops may also be partially etched via the anisotropic etching and thus may be planarized.

In this way, a pattern having a shape close to the shape of an intended pattern may be obtained without forming protrusions. Since no protrusions are formed in an upper portion of the pattern, a material layer may be formed conformally on the entire surface of the substrate 110 without forming voids.

FIGS. 3A-3D are cross-sectional side views illustrating a pattern-forming method according to another exemplary embodiment of the inventive concept.

Figure 3A:
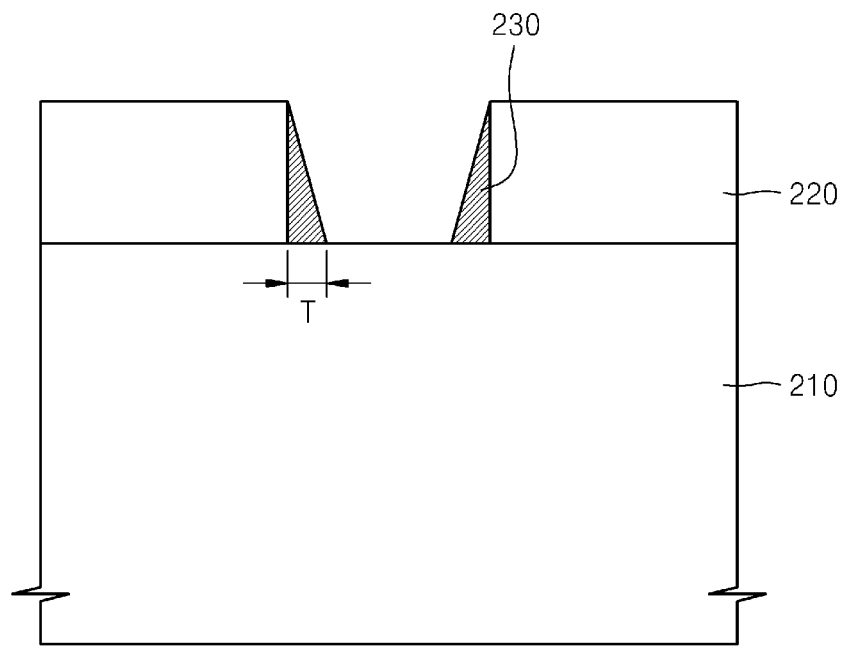
FIGS. 3A-3D are cross-sectional side views illustrating a pattern-forming method according to another exemplary embodiment of the inventive concept.

Referring to FIG. 3A, a mask pattern 220 is formed on a substrate 210. As described above, the mask pattern 220 may be a photoresist, a silicon nitride layer, a silicon oxide layer, a silicon oxynitride layer, or a carbon-based material layer, such as an amorphous carbon layer (ACL) and a spin-on-hardmask (SOH). The mask pattern 220 may have substantially the same size and/or shape as a pattern desired to be formed in the substrate 210.

Next, an auxiliary mask pattern 230 may be formed on a sidewall of the mask pattern 220. The auxiliary mask pattern 230 may be, for example, a fluorine-based polymer. The auxiliary mask pattern 230 may be formed by plasma-exciting, for example, a $C_xF_y$-based precursor, and depositing the $C_xF_y$-based precursor on the sidewall of the mask pattern 220. The $C_xF_y$-based precursor may be, for example, $C_2F_6$, $C_3F_8$, $CHF_3$, $CH_2F_2$, or $C_4F_8$. When the $C_xF_y$-based precursor is deposited on the surface of the mask pattern 220, a fluorine-based polymer, such as a PTFE, may be formed on the sidewall of the mask pattern 220.

The auxiliary mask pattern 230 may be formed on the sidewall of the mask pattern 220 by applying a bias voltage to the substrate 210 during the deposition of the $C_xF_y$-based precursor. The material of the mask pattern 220 may be the same as that of the auxiliary mask pattern 230.

Although the auxiliary mask pattern 230 illustrated in FIG. 3A has a lower portion that is thicker than an upper portion is, the auxiliary mask pattern 230 may alternatively have a substantially uniform thickness in a horizontal direction.

A thickness T of a portion of the auxiliary mask pattern 230 that contacts the substrate 210 in the horizontal direction may be determined according to a degree to which the substrate 210 is etched in the horizontal direction due to the above-described DRIE. In other words, the auxiliary mask pattern 230 may contact the substrate 210 along a stretch as great as the horizontal-direction thickness T corresponding to the margin M of FIG. 2A.

Figure 3B:
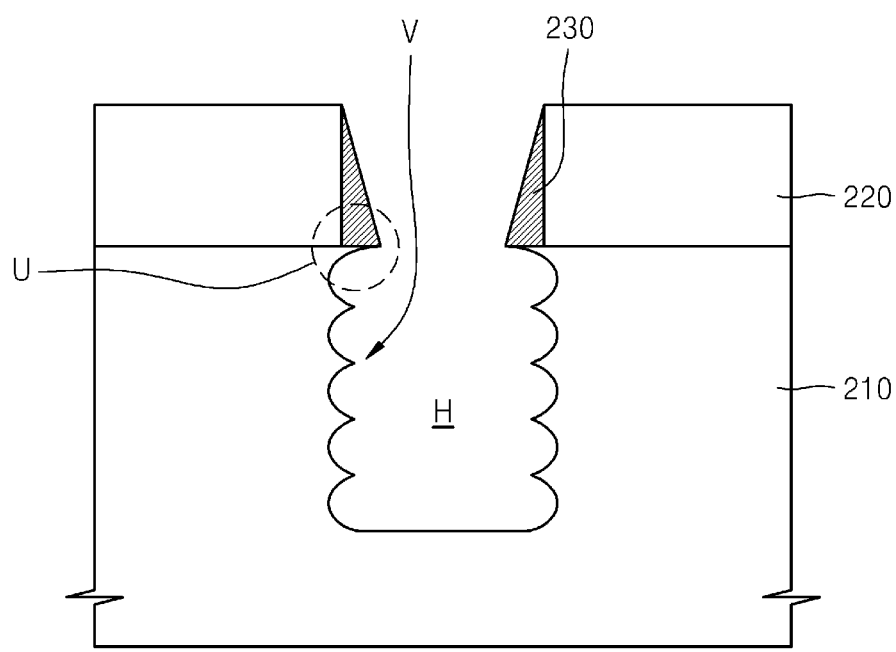

Referring to FIG. 3B, a hole H is formed via the DRIE, as explained above. A protrusion U may be formed for the same reason as described above with reference to FIG. 2B. Crests V of a plurality of scallops that form a wave may protrude less than the protrusion U. However, the troughs of the scallops may be recessed to almost identical depths. A method of executing the DRIE has already been explained above with reference to FIGS. 1A-1F, so a detailed description thereof will be omitted here.

Figure 3C:
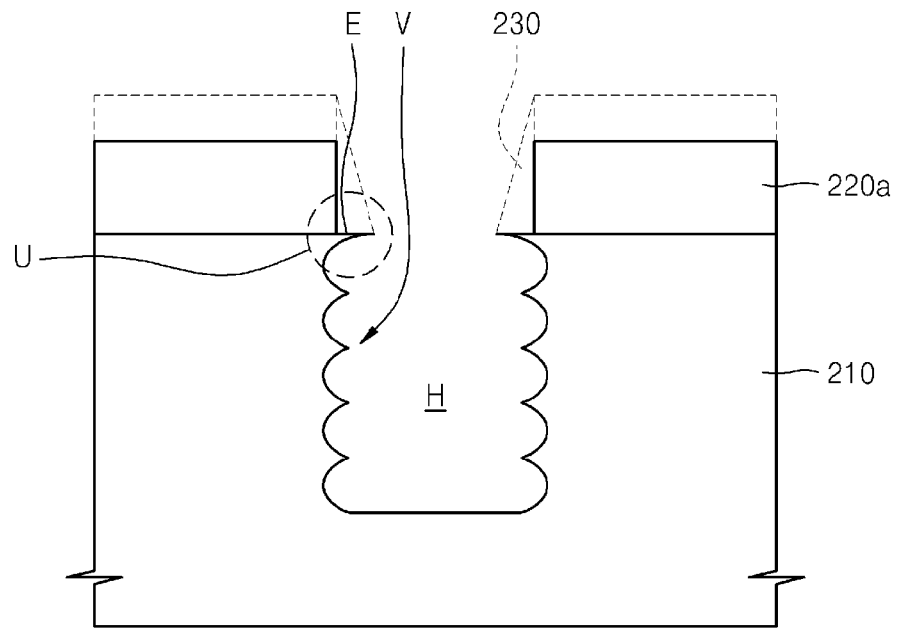

Referring to FIG. 3C, a part of the mask pattern 220 and the auxiliary mask pattern 230 may be removed. Removal of part of the mask pattern 220 and removal of the auxiliary mask pattern 230 may be performed simultaneously or separately. When the material of the mask pattern 220 is the same as that of the auxiliary mask pattern 230, the removal of part of the mask pattern 220 and the removal of the auxiliary mask pattern 230 may be performed simultaneously. When the materials of the mask pattern 220 and the auxiliary mask pattern 230 are different and etching rates thereof are also different, the removal of part of the mask pattern 220 and the removal of the auxiliary mask pattern 230 may be performed separately.

For example, when the mask pattern 220 is formed of photoresist and the auxiliary mask pattern 230 is formed of the above-described PTFE-based polymer, the removal of part of the mask pattern 220 and the removal of the auxiliary mask pattern 230 may be performed simultaneously via oxygen-based ashing. In particular, the removal of part of the mask pattern 220 may be conducted in a vertical direction, which is the thickness direction of the mask pattern 220. Consequently, as illustrated in FIG. 3C, the vertical-direction thickness of a mask pattern 220a, which is a result of the removal of part of the mask pattern 220, may be less than the original thickness of the mask pattern 220 in the vertical direction.

Since the auxiliary mask pattern 230 is removed, the size of a hole in the mask pattern 220a of FIG. 3C is greater than that of a hole in a mask pattern 220 that is subject to the DRIE. Since the horizontal-direction thickness T of the portion of the auxiliary mask pattern 230 that contacts the substrate 210 is determined according to the degree to which the substrate 210 is recessed to an area under the auxiliary mask pattern 230 and/or under the mask pattern 220 during the DRIE, as described above; the mask pattern 220a, after the removal of the auxiliary mask pattern 230, may have the same size and shape as a pattern originally intended to be formed on the substrate 210.

Figure 3D:
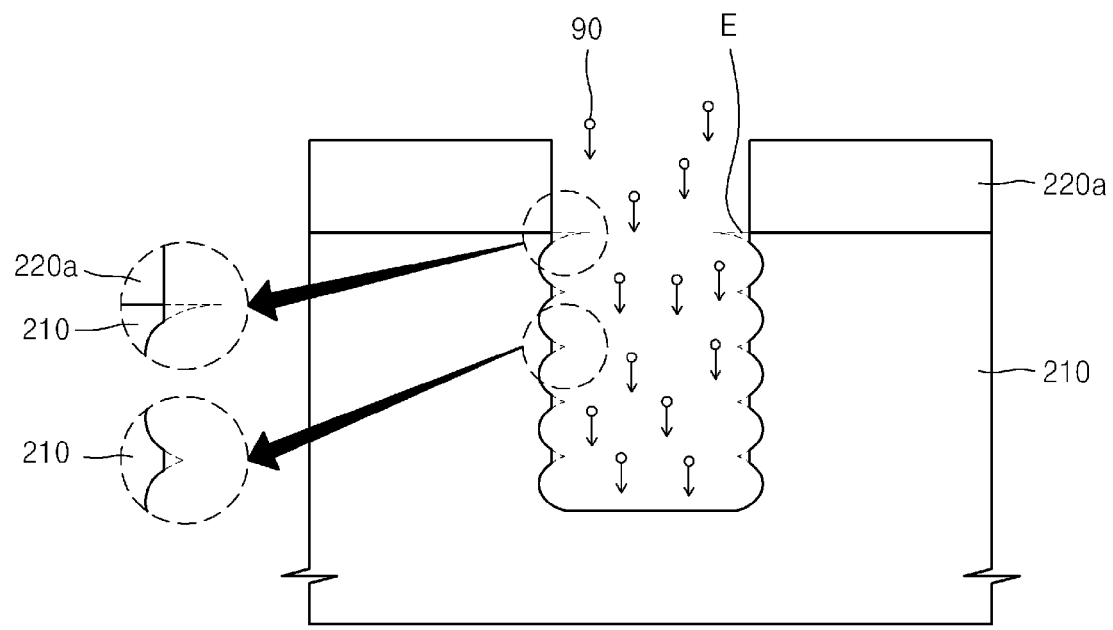

Referring to FIG. 3D, the substrate 210 is anisotropically etched using the mask pattern 220a as an etch mask. Consequently, a considerable amount of the protrusion U of FIG. 3C may be removed. The crests V between adjacent scallops may also be partially etched via the anisotropic etching and thus may be planarized.

Although examples where the holes H are formed in the substrates 110 and 210 have been illustrated above, a pattern-forming method according to the inventive concept is not limited to the formation of a hole. It will be understood by one of ordinary skill in the art that methods according to the inventive concept may also be used in forming any pattern other than a hole.

FIGS. 4A-4F are cross-sectional side views illustrating a through-silicon via hole-forming method according to an exemplary embodiment of the inventive concept.

Figure 4A:
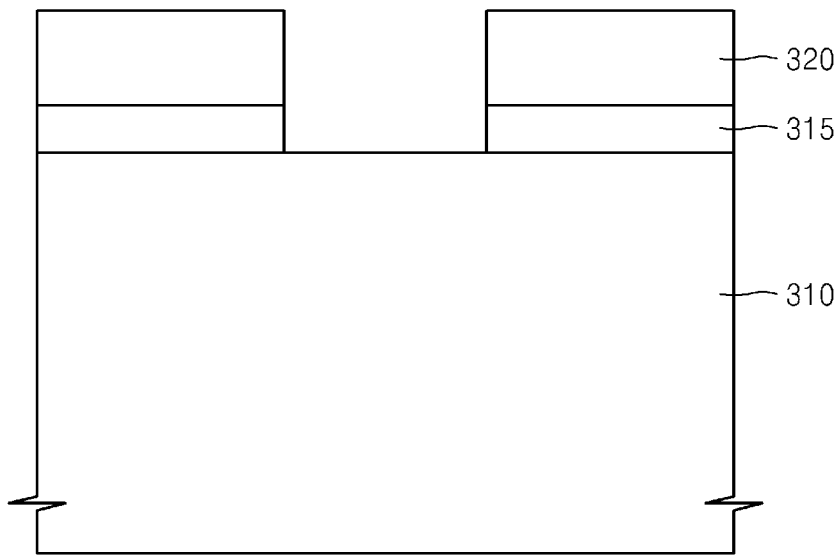
FIGS. 4A-4F are cross-sectional side views illustrating a method for forming a through-silicon via hole according to an exemplary embodiment of the inventive concept.

Referring to FIG. 4A, a semiconductor substrate 310 having a material layer 315 formed on one surface thereof is prepared.

The semiconductor substrate 310 may include a semiconductor material, such as a Group IV semiconductor, a Group III-V compound semiconductor, or a Group II-VI oxide semiconductor. For example, the Group IV semiconductor may include silicon, germanium, or silicon-germanium. The semiconductor substrate 310 may be a bulk wafer or an epitaxial layer. Alternatively, the semiconductor substrate 310 may be an SOI substrate, a gallium-arsenide substrate, a silicon germanium substrate, a ceramic substrate, a quartz substrate, or a glass substrate for use in displays. Unit devices (not shown) for forming a semiconductor device, such as various types of active devices or passive devices, may be formed on the semiconductor substrate 310. Device isolation layers (not shown) for isolating the unit devices from one another may also be formed on the semiconductor substrate 310. The isolation layers may be formed by, for example, local oxidation of silicon (LOCOS) or by shallow trench isolation (STI).

The material layer 315 may be an interlayer dielectric (ILD) layer that covers the unit devices. Conductive regions (not shown) that may be electrically connected to the unit devices via the material layer 315 may also be formed on the semiconductor substrate 310. Conductive lines (not shown) for connecting the unit devices and the conductive regions to one another may also be formed on the material layer 315. The material layer 315 may be a silicon oxide layer or a silicon nitride layer.

A mask pattern 320 is formed on the material layer 315, and the material layer 315 is etched using the mask pattern 320 as an etch mask, thereby transferring the pattern of the mask pattern 320 to the material layer 315. The mask pattern 320 may be a photoresist, a silicon nitride layer, a silicon oxide layer, a silicon oxynitride layer, or a carbon-based material layer, such as a spin-on-hardmask (SOH) and an amorphous carbon layer (ACL). The mask pattern 320 may have substantially the same size and/or shape as a pattern desired to be formed on the semiconductor substrate 310.

Figure 4B:
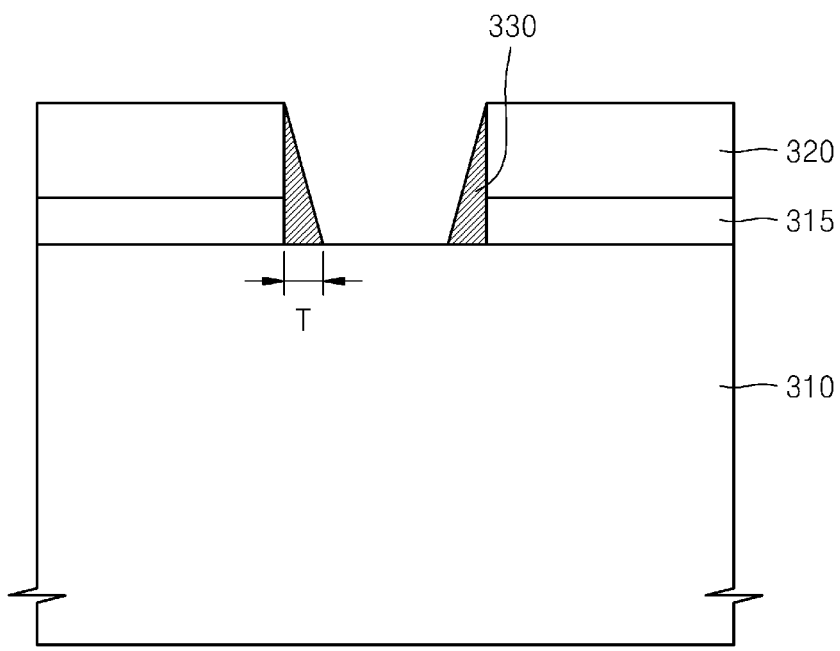

Referring to FIG. 4B, an auxiliary mask pattern 330 may be formed on a sidewall of the mask pattern 320 and/or on a sidewall of the material layer 315. Descriptions related to the auxiliary mask pattern 330 have already been made in detail in the explanation of the auxiliary mask pattern 230 with reference to FIG. 3A, so an additional description thereof will be omitted. As described above, a horizontal-direction thickness T of a portion of the auxiliary mask pattern 330 that contacts the semiconductor substrate 310 may be determined according to the degree to which the semiconductor substrate 310 is etched in the horizontal direction due to DRIE which is to be performed after.

Figure 4C:
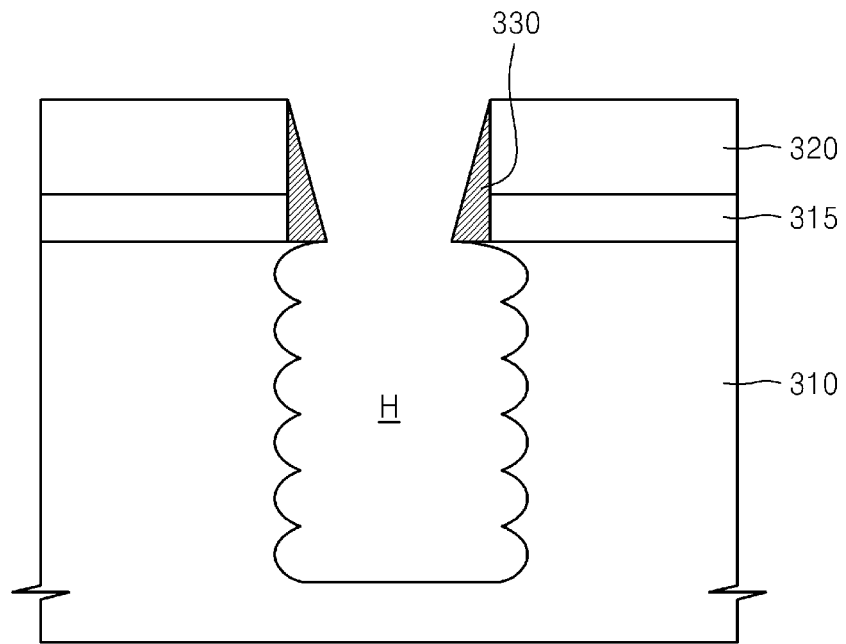

Referring to FIG. 4C, the DRIE is performed using the mask pattern 320 and the auxiliary mask pattern 330 as etch masks, thereby etching the semiconductor substrate 310. The DRIE process has already been explained, above, with reference to FIGS. 1A-1F, so a detailed description thereof will be omitted herein.

In FIGS. 4C-4F, results of etching of the right and left sides of a hole H are illustrated differently in order to explain various aspects of DRIE. In other words, the result of etching of the left side of the hole H in FIGS. 4C-4F represents a case where the crests of a wave formed by consecutive scallops protrude more than a vertical extension line of the mask pattern 320 and the troughs of the wave are recessed more than the vertical extension line of the mask pattern 320. On the other hand, the result of etching of the right side of the hole H in FIGS. 4C-4F represents a case where both the crests and troughs of a wave formed by consecutive scallops are recessed more than the vertical extension line of the mask pattern 320, as described in detail below.

Figure 4D:
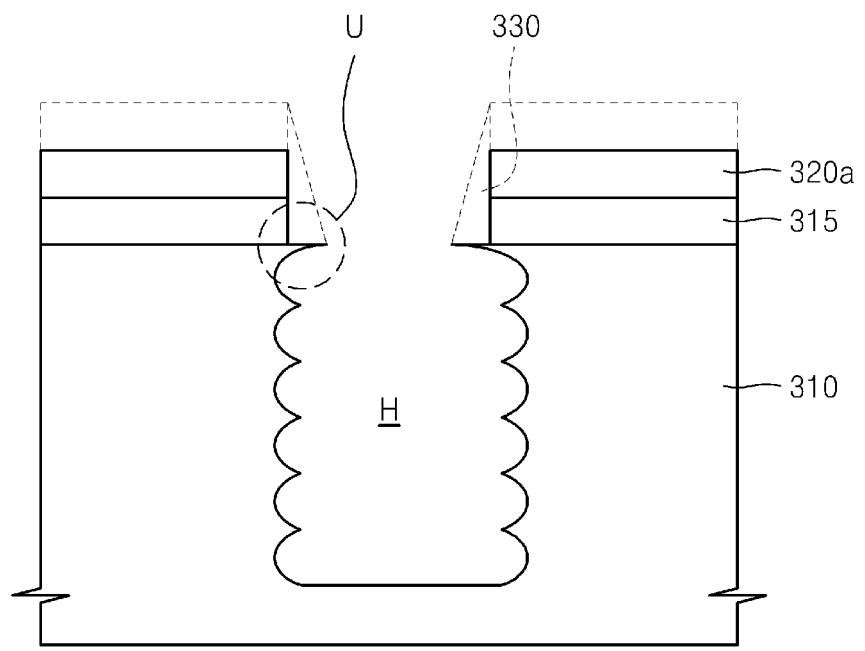

Referring to FIG. 4D, the auxiliary mask pattern 330 is removed. The mask pattern 320 may also be partially removed. Because the auxiliary mask pattern 330 is removed, a portion of the upper surface of the substrate 310 that was covered by the auxiliary mask pattern 330 may be exposed. The removal of the auxiliary mask pattern 330 may be performed using, for example, an oxygen-based ashing method, but is not limited thereto.

Removal of part of the mask pattern 320 and removal of the auxiliary mask pattern 330 may be performed simultaneously or separately. When the material of the mask pattern 320 is the same as that of the auxiliary mask pattern 330, the removal of part of the mask pattern 320 and the removal of the auxiliary mask pattern 330 may be performed simultaneously. When the materials of the mask pattern 320 and the auxiliary mask pattern 330 are different and etching rates thereof are also different, the removal of part of the mask pattern 320 and the removal of the auxiliary mask pattern 330 may be performed separately.

In particular, the material layer 315 may have a sufficient etch selectivity to prevent the material layer 315 from being substantially etched due to the removal of the auxiliary mask pattern 330.

As shown in FIG. 4D, the portion of the upper surface of the substrate 310 that is exposed due to the removal of the auxiliary mask pattern 330 may correspond to all or a part of a protrusion U.

At the same time when the auxiliary mask pattern 330 is removed, a protective layer (not shown; refer to the protective layer 30a of FIG. 1D) formed on the inner wall of the hole H to perform DRIE may be removed. When substantially the same material as that used to form the auxiliary mask pattern 330 or a material having etching characteristics similar to those of the material used to form the auxiliary mask pattern 330 is used to form the protective layer, the protective layer and the auxiliary mask pattern 330 may be removed simultaneously.

Figure 4E:
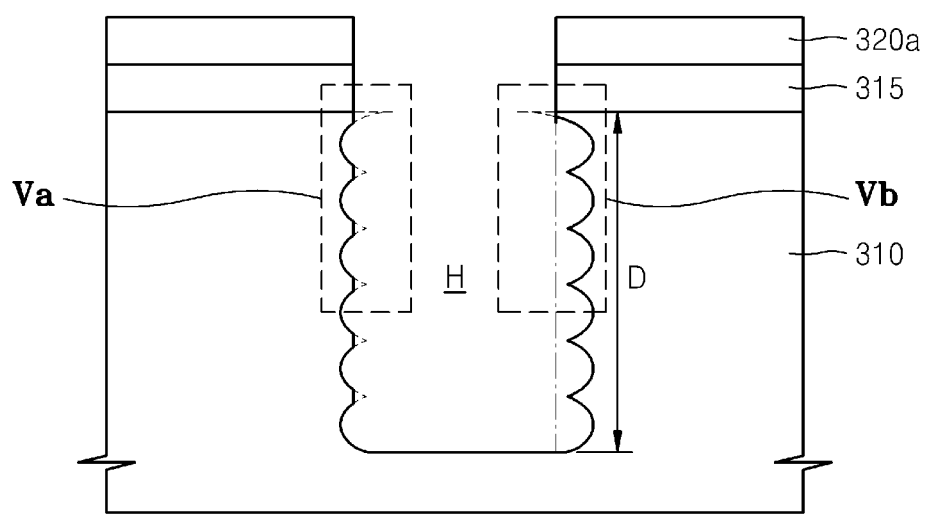

Referring to FIG. 4E, the substrate 310 is anisotropically etched using the mask pattern 320a as an etch mask. Through the anisotropic etching, the protrusion U of FIG. 4D may be removed, as described in greater detail below with reference to FIGS. 5A and 5B. The hole H may have a depth of about 5 μm to about 500 μm. Although the hole H is formed as a result of the DRIE in FIG. 4E, a hole that passes through the substrate 310 may be formed.

Figure 4F:
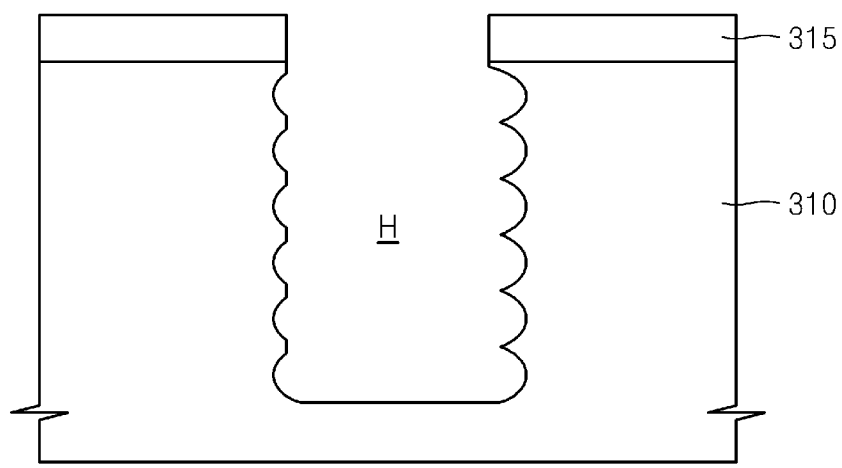

Referring to FIG. 4F, a through-silicon via hole H may be obtained by removing the mask pattern 320a. To form the through-silicon via, the hole H is filled with a conductive material; and then the semiconductor substrate 310 may be back-lapped.

FIGS. 5A and 5B are magnified views of portions Va and Vb, respectively, of FIG. 4E. Referring to FIG. 5A, the crests and troughs of the wave formed by consecutive scallops may be at opposite sides of a vertical extension line L1 of the mask pattern 320a. In this case, the crests of the wave may be removed together with the protrusion U through the anisotropic etching. In other words, cut portions between the scallops may be aligned on a straight line.

Referring to FIG. 5B, both the crests and troughs of the wave formed by consecutive scallops may be at one side of a vertical extension line L2 of the mask pattern 320a that faces the semiconductor substrate 310. In this case, the crests of the wave formed by consecutive scallops may be scarcely planarized even when the protrusion U is removed through the isotropic etching.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims.

What is claimed is:

1. A method of forming a pattern, the method comprising:
forming a mask pattern on a substrate;
forming an auxiliary mask pattern on a sidewall of the mask pattern;
after forming the auxiliary mask pattern, etching the substrate by deep reactive ion etching and by using the mask pattern as an etch mask;
removing the auxiliary mask pattern and a portion of the mask pattern to expose a portion of an upper surface of the substrate; and
etching the exposed portion of the upper surface of the substrate.

2. The method of claim 1, wherein the removal of a portion of the mask pattern further comprises vertically removing the mask pattern.

3. The method of claim 2, wherein the vertical removal of the mask pattern and the removal of the auxiliary mask pattern are simultaneously performed.

4. The method of claim 1, wherein the removal of a portion of the mask pattern to expose the portion of the upper surface of the substrate is performed by isotropic etching.

5. The method of claim 1, wherein a material layer is formed between the substrate and the mask pattern.

6. The method of claim 5, wherein the material layer comprises a silicon oxide.

7. The method of claim 1, wherein the etching of the substrate by the deep reactive ion etching comprises:
performing isotropic etching;
forming a protective layer on a result of the isotropic etching; and
performing anisotropic etching on a portion of the protective layer to remove the portion of the protective layer, and
the performing of the isotropic etching, the forming of the protective layer, and the removing of the portion of the protective layer constitute a cycle which is performed at least twice.

8. The method of claim 1, wherein a depth to which the substrate is etched by the deep reactive ion etching is in a range from 5 μm to 500 μm.

9. The method of claim 1, wherein the substrate is a semiconductor substrate having a material layer formed on one surface of the semiconductor substrate, wherein the mask pattern is formed on the material layer, wherein the material layer is etched by using the mask pattern as the etch mask, wherein the auxiliary mask pattern is formed on a sidewall of the material layer, wherein the semiconductor substrate is etched by using the mask pattern and the auxiliary mask pattern as etch masks.

10. The method of claim 9, wherein the material layer is an interlayer dielectric layer.

11. The method of claim 9, wherein the material layer has a sufficient etch selectivity such that the material layer is not substantially etched in the removing of the auxiliary mask pattern.

12. The method of claim 9, wherein the auxiliary mask pattern comprises a carbon-based polymer material.

13. A method of forming a pattern, the method comprising:
forming a mask pattern on a substrate;
etching the substrate by deep reactive ion etching and by using the mask pattern as an etch mask, wherein a plurality of scallops are adjacently generated on a lateral-direction surface of the substrate that is obtained in the etching of the substrate by the deep reactive ion etching;
partially removing the mask pattern to expose a portion of an upper surface of the substrate; and
etching the exposed portion of the upper surface of the substrate, wherein crests between the scallops are smoothed in the etching of the exposed portion of the upper surface of the substrate.

14. A method of forming a semiconductor device, the method comprising:
forming a material layer on a substrate;
forming a first pattern on the material layer;
patterning the material using the first pattern;
forming a second pattern on sidewalls of the first pattern and of the patterned material layer;
etching the substrate using the first pattern and the second pattern as an etch mask;
removing the second pattern; and
after removing the second pattern, etching the substrate using the first pattern.

15. The method of claim 14, further comprising: while removing the second pattern, removing a portion of the first pattern.

16. The method of claim 14, wherein etching the substrate using the first pattern and the second pattern as an etch mask comprises:
performing a first isotropic etching to the substrate;
forming a first protective layer on the first exposed substrate;
performing a first anisotropic etching on a portion of the first protective layer;
performing a second isotropic etching to the substrate;
forming a second protective layer on the second exposed substrate;
performing a second anisotropic etching on a portion of the second protective layer.

17. The method of claim 16, wherein performing the first and second isotropic etching uses at least one of $SF_6$, $NF_3$, $XeF_2$, $F_2$, $CF_4$, $HBr$, $Cl_2$, $ClF_3$, and $HF$.

18. The method of claim 14, wherein the second pattern comprises a carbon based polymer material.

19. The method of claim 14, wherein etching the substrate using the first pattern and the second pattern as an etch mask generates a hole in the substrate and at least one concave portion is formed on a sidewall of the hole.

20. The method of claim 19, wherein the sidewall of the hole becomes smooth after etching the concave portion of the substrate using the first pattern.

* * * * *